(12) United States Patent
Pring

(10) Patent No.: US 10,931,231 B2
(45) Date of Patent: Feb. 23, 2021

(54) VARIABLE FREQUENCY OSCILLATOR CIRCUITS AND METHODS OF GENERATING AN OSCILLATING SIGNAL OF A DESIRED FREQUENCY

(71) Applicant: BAE SYSTEMS plc, London (GB)

(72) Inventor: Philip Charles Jarrett Pring, Guildford (GB)

(73) Assignee: BAE SYSTEMS plc, London (GB)

(*) Notice: Subject to any disclaimer, the term of this patent is extended or adjusted under 35 U.S.C. 154(b) by 0 days.

(21) Appl. No.: 16/469,953

(22) PCT Filed: Dec. 11, 2017

(86) PCT No.: PCT/GB2017/053701
§ 371 (c)(1),
(2) Date: Jun. 14, 2019

(87) PCT Pub. No.: WO2018/109444
PCT Pub. Date: Jun. 21, 2018

(65) Prior Publication Data
US 2020/0083842 A1    Mar. 12, 2020

(30) Foreign Application Priority Data

Dec. 14, 2016 (GB) ..................................... 1621222
Jan. 12, 2017 (EP) ..................................... 17151165

(51) Int. Cl.
*H03B 1/04* (2006.01)
*H03B 19/14* (2006.01)
(Continued)

(52) U.S. Cl.
CPC ............... *H03B 1/04* (2013.01); *H03B 19/14* (2013.01); *H03B 21/01* (2013.01); *H03D 7/16* (2013.01); *H03D 7/18* (2013.01)

(58) Field of Classification Search
CPC ........ H03B 19/14; H03B 21/01; H03B 19/00; H03B 1/04; H03D 7/165; H03D 7/16; H03D 7/18

See application file for complete search history.

(56) References Cited

U.S. PATENT DOCUMENTS 8,699,985 B1    4/2014   Mar
2002/0180538 A1   12/2002   Soorapanth et al.
(Continued)

FOREIGN PATENT DOCUMENTS

EP    0951138 A1    10/1999
EP    1931033 A2    6/2008
(Continued)

OTHER PUBLICATIONS

International Preliminary Report on Patentability received for PCT Application No. PCT/GB2017/053701. dated Jun. 27, 2019. 10 pages.
(Continued)

*Primary Examiner* — Ryan Johnson
(74) *Attorney, Agent, or Firm* — Finch & Maloney PLLC

(57) ABSTRACT

A variable frequency oscillator circuit for generating an oscillating signal of a desired frequency, comprising a fixed frequency oscillator; one or more frequency dividers, arranged to receive the output of the fixed frequency oscillator and generate a signal with a divided frequency; and one or mixers, arranged to mix the outputs of the one or more frequency dividers to generate the oscillating signal of the desired frequency. The variable frequency oscillator circuit is arranged to modify the operation of the one or more mixers to suppress any unwanted signals in the generated oscillating signal.

20 Claims, 3 Drawing Sheets

(51) Int. Cl.
*H03B 21/01* (2006.01)
*H03D 7/16* (2006.01)
*H03D 7/18* (2006.01)

(56) References Cited

U.S. PATENT DOCUMENTS

| | | |
|---|---|---|
| 2003/0129955 A1 | 7/2003 | Gilmore |
| 2006/0057994 A1 | 3/2006 | Anand |
| 2008/0055009 A1 | 3/2008 | Lerner et al. |
| 2008/0055014 A1 | 3/2008 | Tsfaty |
| 2009/0189700 A1 | 7/2009 | Kuroda |
| 2010/0097531 A1 | 4/2010 | Miura |
| 2010/0271106 A1 | 10/2010 | Deguchi et al. |
| 2011/0268163 A1* | 11/2011 | Fillatre .................. H04B 15/06 375/219 |
| 2015/0055726 A1 | 2/2015 | Yamaji et al. |

FOREIGN PATENT DOCUMENTS

| | | |
|---|---|---|
| EP | 2383914 A1 | 11/2011 |
| GB | 2165425 A | 4/1986 |

OTHER PUBLICATIONS

International Search Report and Written Opinion received for PCT Application No. PCT/GB2017/053701. dated Mar. 16, 2018. 12 pages.
GB Search Report under Section 17(5) received for GB Application No. 1621222.7 dated May 25, 2017. 5 pages.
Extended European Search Report received for EP Application No. 17151165.2, dated Jul. 6, 2017. 10 pages.

\* cited by examiner

VARIABLE FREQUENCY OSCILLATOR CIRCUITS AND METHODS OF GENERATING AN OSCILLATING SIGNAL OF A DESIRED FREQUENCY

FIELD OF THE INVENTION

The present invention concerns variable frequency oscillator circuits and methods of generating an oscillating signal of a desired frequency. More particularly, but not exclusively, the invention concerns superheterodyne radio receiver circuits operating at microwave and ultrahigh frequencies.

BACKGROUND OF THE INVENTION

Superheterodyne ("superhet") is a well-established radio receiver architecture. A superhet receiver circuit uses frequency mixing with a local oscillator (LO) to convert a received radio signal to an intermediate frequency (IF) ahead of further signal processing. However, it is a feature of superhet receiver circuits that during conversion of the received radio signal, as well as the desired signal, signals originating from an "image" frequency can be present.

If the desired signal is at a frequency that is the sum of the IF frequency and the LO frequency, then the image frequency is the difference between LO and IF frequencies. If the desired signal is at a frequency that is the difference of the LO frequency and the IF frequency, then the image frequency is the sum of the LO and IF frequencies.

In traditional superhet receiver circuits, the IF frequency is removed as far as practicable using a radio frequency filter, known as an "image-reject filter", before frequency mixing. This is because after mixing using a single mixer, the image signal is at the IF frequency and cannot be separated.

Further suppression of the image frequency can be achieved in a superhet receiver circuit after mixing using a special type of frequency mixer known as an "image-reject mixer". This is usually followed by a quadrature combiner to select the desired signal.

The degree of image rejection provided by an image-reject mixer alone is often insufficient, due to imbalances within the image-reject mixer and quadrature components, but an image-reject mixer can reduce the performance requirement of the image-reject filter.

A part of an example superhet receiver circuit using an image-reject mixer is shown in FIG. 1. The superhet receiver circuit 10 receives a radio frequency (RF) signal 1, which is amplified by an amplifier 11; other desirable filtering, attenuation etc. of the signal may also be performed at this stage. The amplified signal is then passed to an image-reject mixer 2. The image-reject mixer 2 also receives the output of a variable frequency oscillator 7; the frequency of the variable frequency oscillator 7 is selected to tune the receiver to the desired frequency.

The image-reject mixer 2 comprises a signal splitter 3, quadrature splitter 4, and frequency mixers 5 and 6. The amplified signal from the amplifier 11 is received by the signal splitter 3, and the two split signals are passed to the mixers 5 and 6. The output from the variable frequency oscillator 7 is received by the quadrature splitter 4, and the in-phase (I) component is passed to the mixer 5, and the quadrature (Q) component is passed to the mixer 6. The I and Q components of the amplified signal are then passed to a quadrature hybrid circuit 8, which extracts the desired part of the signal 9 before passing it to the rest of the receiver circuit.

As discussed above, it is a feature of superhet receivers that there may be signals at an image frequency that need to be suppressed. To give an example, the superhet receiver circuit 10 may have an IF of 400 MHz. To receive a radio signal of 1000 MHz, the variable frequency oscillator 7 is tuned to 600 MHz, so that the radio signal and oscillator signal mix to the required frequency of 400 MHz. However, as the mixers will generate both sum and difference frequencies, received radio signals at frequency 200 MHz will also mix to 400 MHz. The received radio signals at 200 MHz are the image frequency signals that need to be suppressed. The superhet receiver circuit 10 may, for example, be able to suppress all but 1% of the unwanted image frequency signals (i.e. 1 in 100 suppression).

One reason that more of the image frequency signals are not suppressed can be due to unwanted variations in the characteristics of the components of the image-reject mixer 2. For example, the signal splitter 3 may not evenly split the signal it receives, and/or the quadrature splitter 4 may not evenly split the oscillator signal into I and Q components, and/or the components of the image-reject mixer 2 may introduce unwanted delay, gain and the like.

It may be desirable to suppress the image frequency signals to a greater degree than can be achieved by the image-reject mixer 2 and quadrature hybrid circuit 8 alone. For example, with microwave frequency receivers it may be necessary to suppress all but 0.0001% of the unwanted image frequency signals (i.e. 1 in 1,000,000 suppression). Various techniques to further suppress image frequency signals are known. One technique is to filter the RF signal 1 to suppress the image frequency signal before it reaches image-reject mixer 2. At microwave frequencies, a cavity filter may be used. However, cavity filters can be very bulky and expensive.

Another problem with superhet receiver circuits, particularly (but not exclusively) when operating at microwave frequencies, is that a low phase noise variable frequency oscillator can be difficult to provide. This means that variable frequency oscillator may suffer from short-term frequency movement affecting the performance of the receiver. Variable frequency oscillators that do not suffer from these disadvantages can be bulky and/or expensive.

The present invention seeks to mitigate the above-mentioned problems. Alternatively and/or additionally, the present invention seeks to provide improved variable frequency oscillator circuits and methods of generating an oscillating signal of a desired frequency.

SUMMARY OF THE INVENTION

In accordance with a first aspect of the invention there is provided a variable frequency oscillator circuit for generating an oscillating signal of a desired frequency, comprising:
  a fixed frequency oscillator;
  one or more frequency dividers, arranged to receive the output of the fixed frequency oscillator and generate a signal with a divided frequency;
  one or more mixers, arranged to mix the outputs of the one or more frequency dividers to generate the oscillating signal of the desired frequency;
  wherein the variable frequency oscillator circuit is arranged to modify the operation of the one or more mixers to suppress any unwanted signals in the generated oscillating signal.

Using a fixed frequency oscillator allows a reliable oscillating signal to be provided relatively easily and cheaply. Dividing and mixing the signal from the fixed frequency oscillator as required then allows the oscillating signal at a desired frequency to be generated. (It will be appreciated that it will be possible to generate a certain set of discrete frequencies depending on the particular arrangement of the dividers and mixers.) The dividers and in particular the mixers may lead to unwanted signals in the generated oscillating signal, for example due to unwanted variations in the characteristics in the analogue components of the mixers. However, by monitoring the generated oscillating signal to identify any unwanted signals, those unwanted signals can be suppressed by modifying the operation of the mixers.

Preferably, the one or more mixers are image-reject mixers, and the unwanted signals include image frequency signals.

The variable frequency oscillator circuit may be arranged to suppress unwanted signals using calibration values determined for the variable frequency oscillator circuit. In other words, before actual operation the output of the variable frequency oscillator circuit can be tested and the operation of the one or more mixers modified to optimally suppress any unwanted signals in the generated oscillating signal.

The variable frequency oscillator circuit may further comprise a filter arranged to suppress unwanted signals output by a mixer of the one or more mixers. The filter may be a high-pass filter.

Advantageously, the variable frequency oscillator circuit further comprises a receiver arranged to receive the generated oscillating signal and identify unwanted oscillating signals at frequencies other than the desired frequency. As the desired oscillating frequency is known, the receiver can easily monitor for unwanted signals, i.e. energy, at other frequencies.

Advantageously, the receiver is a digitising receiver. In this case, advantageously the digitising receiver is comprised in a MIMO integrated circuit.

Preferably, at least one mixer of the one or more mixers is arranged to receive an in-phase signal and a quadrature signal.

Advantageously, the variable frequency oscillator circuit is arranged to modify the operation of the mixer by adjusting the DC levels of the received in-phase signal and quadrature signal. This in particular allows leakage of an input oscillating signal directly to the output of a mixer to be suppressed.

Advantageously, the variable frequency oscillator circuit is arranged to modify the operation of the mixer by adjusting the amplitude and/or phase of the received in-phase signal and quadrature signal. This in particular allows unwanted image frequency signals to be suppressed. The amplitude may be adjusted by gain adjustment and the phase may be adjusted by a phase shifter.

Advantageously, the variable frequency oscillator circuit further comprises a phase and/or frequency modulator arranged to modulate the phase and/or frequency of the generated oscillating signal of the desired frequency. The modulation can be advantageously used by circuits that use the variable frequency oscillator circuit as a variable frequency oscillator, for example as described below.

In accordance with a second aspect of the invention there is provided a method of generating an oscillating signal of a desired frequency, comprising the steps of:
generating a fixed frequency oscillating signal;
generating one or more signals with a divided frequency from the fixed frequency oscillating signal;
mixing the one or more divided signals to generate the oscillating signal of the desired frequency;
modifying the mixing of the one or more divided signals to suppress any unwanted signals in the generated oscillating signal.

The unwanted signals may be suppressed using calibration values determined for the variable frequency oscillator circuit. In this case, preferably the method further comprises the step of determining the calibration values for the variable frequency oscillator circuit by analysing the oscillating signal of the desired frequency generated by the variable frequency oscillator circuit.

The method may further comprise the step of modifying the mixing of the one or more divided signals comprises filtering the output of a mixer of the one or more mixers. The filtering may be high-pass filtering.

Advantageously, the step of identifying unwanted oscillating signals at frequencies other than the desired frequency using a receiver that receives the generated oscillating signal. Advantageously, the receiver is a digitising receiver. Advantageously, the digitising receiver is comprised in a MIMO integrated circuit.

Preferably, the step of mixing of the one or more divided signals uses an in-phase signal and a quadrature signal.

Advantageously, the step of modifying the mixing of the one or more divided signals is performed by adjusting the DC levels of the in-phase signal and quadrature signal.

Advantageously, the step of modifying the mixing of the one or more divided signals is performed by adjusting the amplitude and/or phase of the received in-phase signal and quadrature signal. The amplitude may be adjusted by gain adjustment and the phase may be adjusted by a phase shifter.

Advantageously, the method further comprises the step of modulating the phase and/or frequency of at least one of the one or more divided signals to modulate the phase and/or frequency of the generated oscillating signal.

It will of course be appreciated that features described in relation to one aspect of the present invention may be incorporated into other aspects of the present invention. For example, the method of the invention may incorporate any of the features described with reference to the apparatus of the invention and vice versa.

DESCRIPTION OF THE DRAWINGS

Embodiments of the present invention will now be described by way of example only with reference to the accompanying schematic drawings of which.

DETAILED DESCRIPTION

Figure 1:
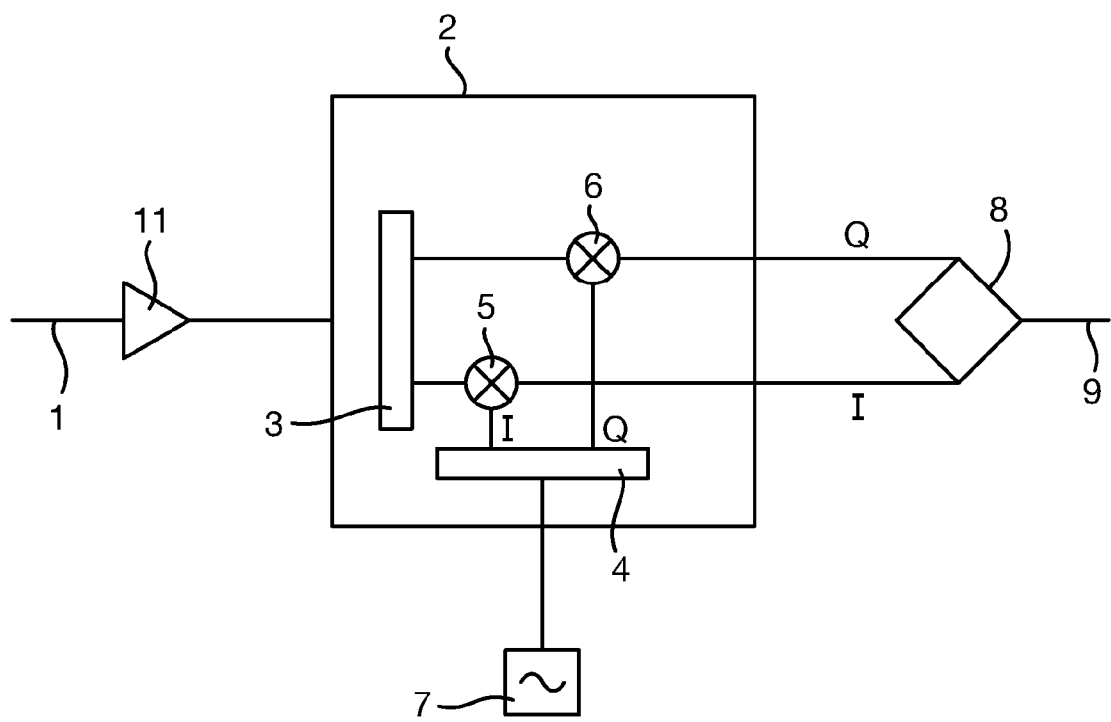
FIG. 1 is a circuit diagram of a part of a known superhet receiver circuit.
Figure 2:
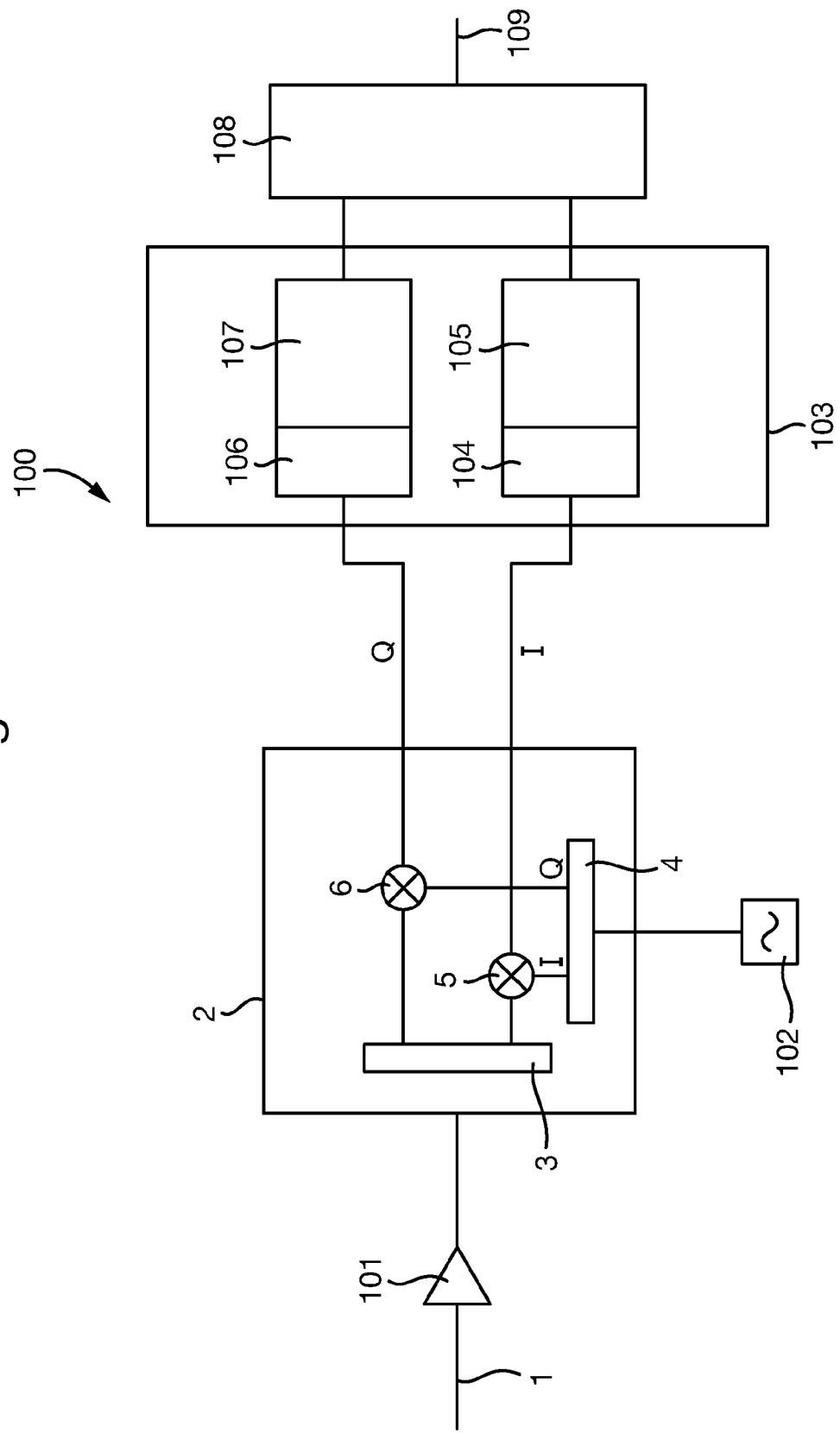
FIG. 2 is a circuit diagram of a part of a superhet receiver circuit in accordance with an embodiment of the invention.

A part of a superhet receiver circuit in accordance with an embodiment of the invention is shown in FIG. 2. As in the known superhet receiver circuit 10 of FIG. 1, the superhet receiver circuit 100 receives an RF signal 1, which is amplified by an amplifier 101, as well as other desirable filtering, attenuation etc. that may be performed. The amplified signal is then passed to the same image-reject mixer 2 as in the known superhet receiver circuit 10, again comprising a signal splitter 3, quadrature splitter 4 and frequency mixers 5 and 6. The image-reject mixer 2 also receives the output of a variable frequency oscillator 102, which is described in more detail later below.

The in-phase and quadrature signals output by the image-reject mixer 2 are then passed to a multiple-input and multiple-output (MIMO) integrated circuit 103. MIMOs are designed for use in integrated radio transceivers that use multiple antennas, and as such conveniently have multiple channels that tune to the same frequency. Thus, the MIMO 103 comprises first and second digitising receivers. The first digitising receiver comprises a tuner 104 and a digitiser 105. The in-phase output of the image-reject mixer 2 is passed to the tuner 104 of the first digitising receiver, which extracts from the in-phase output only the desired frequency signal, i.e. the intermediate frequency signal. The output of the tuner 104 is then passed to the digitiser 105, which digitises only the extracted intermediate frequency signal provided by the tuner 104.

In a similar fashion, the quadrature output of the image-reject mixer 2 is passed to the tuner 106 of the second digitising receiver, which extracts the intermediate frequency signal and passes it to the digitiser 107, which again digitises only the extracted intermediate frequency signal.

The outputs of the digitisers 105 and 107 are then passed to a digital processing circuit 108, which processes the digitised signals to extract the desired part of the signal 109 to pass to the rest of the receiver circuit. In particular, the digital processing circuit 108 processes the digitised signals to suppress (or further suppress) any image frequency signal.

In different embodiments of the invention, the digital processing circuit 108 uses different techniques to process the digitised signals, as discussed below.

As discussed above, one reason for less effective suppression of the image frequency signals is due to unwanted variations in the characteristics of the components of the image-reject mixer 2. To counteract this, the superhet receiver circuit 100 can be calibrated, by providing test signals as the input RF signal 1 to the circuit. These are used to determine calibration values required to effectively suppress the image frequency signals, or in other words to determine the effect of the unwanted variations of the components, and the processing of the digitised signals that is require to counteract those effects.

In another embodiment, during operation (i.e. when in use rather than during a calibration phase), the digital processing circuit 108 compares the power levels of the in-phase signal and quadrature signals over a time period. (That is, the power levels of the original analogue signals as represented by the digitised signals.) If image-reject mixer 2 operates perfectly, the in-phase signal and quadrature signal will over time (if not at any particular instant) have the same overall power level. However, particularly when the signal splitter 3 does not perfectly split the amplified signal from amplifier 101, differences in the power levels of the signals can result. By processing the digitised signals to take account for any difference in the power levels of the signals, the digital processing circuit 108 can suppress any image frequency signals caused by the unwanted difference in power levels.

In yet another embodiment, again during operation, the digital processing circuit 108 determines from the digitised signals the degree of orthogonality of the in-phase signal and the quadrature signal output by the image-reject mixer 2. If image-reject mixer 2 operates perfectly, the in-phase signal and quadrature signal will be perfectly orthogonal. However, particularly when the quadrature splitter 4 does not perfectly split the signal from the variable frequency oscillator 102, the signals may not be perfectly orthogonal. By processing the digitised signals to take account for any lack of orthogonality of the signals, the digital processing circuit 108 can suppress any image frequency signals with the same cause as the lack of orthogonality.

In yet another embodiment, again during operation the digital processing circuit 108 determines any information leakage between the digitised signals. This may occur if the signal splitter 3 does not evenly split the amplified signal from amplifier 101, for example. Similarly to above, by processing the digitised signals to remove any information leakage, in particular information leakage between the desired signal and the image frequency signal predicted by the in-phase signal and the quadrature signal output by the image-reject mixer 2, the digital processing circuit 108 can suppress any image frequency signals with the same cause as the information leakage.

In other embodiments, the digitised signals are statistically analysed, and the results of the analysis used to suppress any image frequency signals. It will be appreciated that various suitable methods of statistical analysis would be known to the skilled person. It will also be appreciated that in other embodiments, multiple techniques to suppress any image frequency signals could be used in combination.

Figure 3:
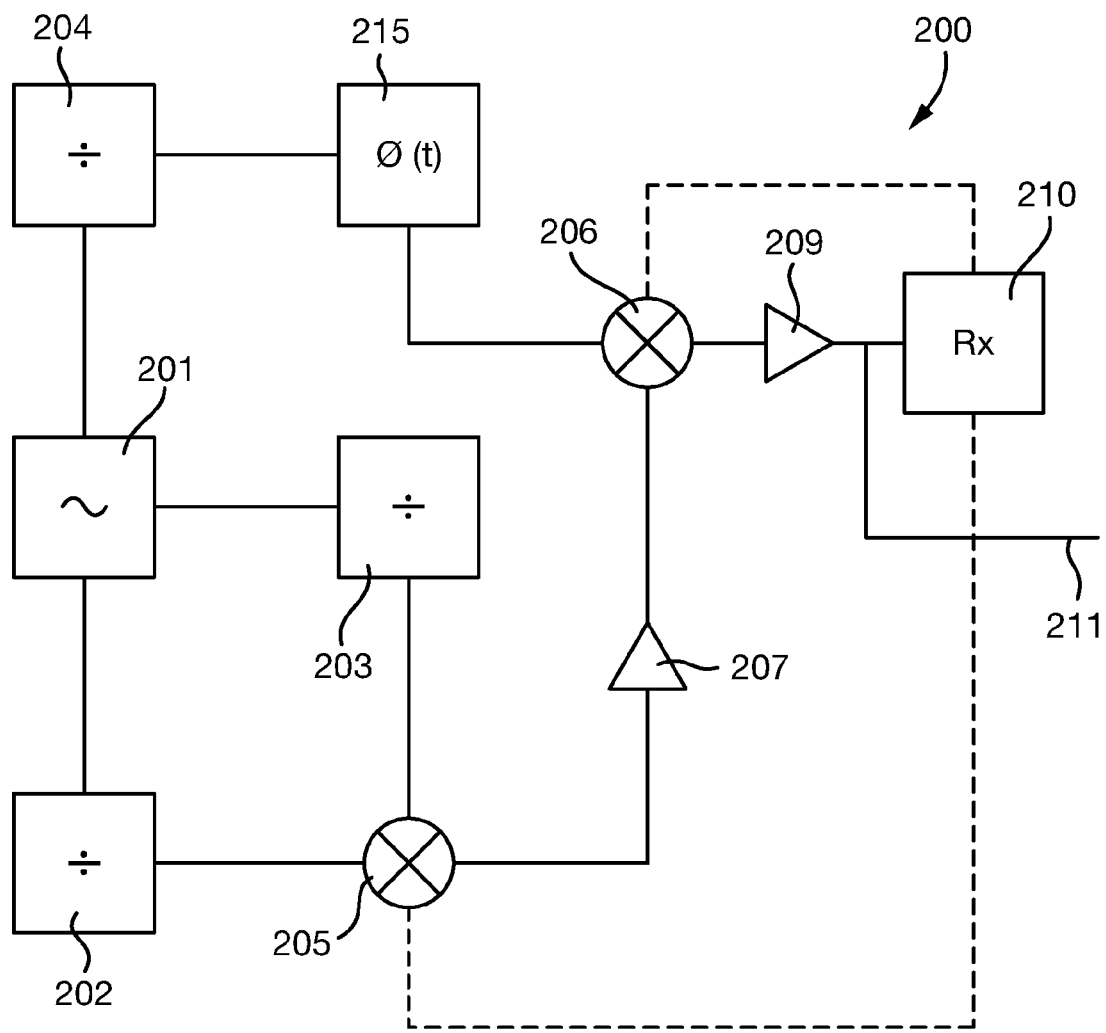
FIG. 3 is a circuit diagram of a variable oscillator circuit in accordance with another embodiment of the invention.

The variable frequency oscillator 102 is now described in detail. The variable frequency oscillator 102 is provided by a variable frequency oscillator circuit 200 as shown in FIG. 3. The variable frequency oscillator circuit 200 comprises a fixed frequency oscillator 201. The output of the fixed frequency oscillator 201 is received by frequency dividers 202, 203 and 204, each of which generates a divided signal from the signal from the fixed frequency oscillator.

The outputs of the frequency dividers 202 and 203 are passed to an image-reject mixer 205, which is IQ-based, i.e. arranged to accept in-phase and a quadrature signals. The signal from the frequency divider 203 is passed to the mixer 205 as the local oscillator (LO) signal (and so split using a quadrature splitter), while the signal from the frequency dividers 202 is passed to the mixer 205 as the intermediate frequency (IF) signal (and so split using a signal splitter). The output of the mixer 205 is then passed to an amplifier 207.

The output of the frequency divider 204 is passed to a modulator 215, which can modulate the signal as described below. The output of the modulator 215 is passed to an image-reject mixer 206, which again is IQ-based, as the IF signal. The output of the amplifier 207 is also passed to the mixer 206, as the LO signal.

The output of the mixer 206 is then passed to an amplifier 209, and the output of the amplifier provides the oscillating signal 211 of the desired frequency. The frequency dividers 202, 203 and 204 divide the signal from the fixed frequency oscillator 201 as required to provide the desired frequency for the oscillating signal 211. For example, the frequency divider 202 may divide the frequency by 4 or 8, or may simply provide a fixed DC output. The frequency divider 203 may divide the frequency by 1 (i.e. leave it as it is) or by 2. The frequency divider 204 may divide the frequency 4, 8, 16 or 32. However, it will be appreciated that many other dividing factors could be used as required, and need not be powers of 2, but could be dividing by powers of 3 or any other desired number. It will also be appreciated that many other arrangements of frequency dividers and mixers could be used in accordance with the invention, to provide a desired frequency oscillation signal. Thus, in different embodiments with different arrangements of dividers and mixers, it will be possible to generate different sets of discrete frequencies.

As mentioned above, the output of the mixer 206 (following amplification by the amplifier 209) provides the oscillating signal 211 of the desired frequency. However, in particular due to unwanted variations in the characteristics of the analogue components of the mixers 205 and 206, there may be unwanted signals in the oscillating signal 211, for example due to leakage of an LO signal directly to the output of a mixer, or image frequencies from the IF signal. To suppress these, the output of the amplifier 209 is also passed to a digitising receiver 210. In the present embodiment the digitising receiver 210 is comprised in a MIMO, but in other embodiments the digitising receiver is provided in other ways, or indeed may be an analogue receiver, for example.

The digitising receiver 210 monitors for energy in frequencies other than the desired oscillation frequency, which will be caused by unwanted signals. These unwanted signals may be caused in a number of ways, for example by unwanted variations in the characteristics of the components of the mixers 205 and 206. To suppress the unwanted signals, the variable frequency oscillator circuit 200 uses the results obtained by the digitising receiver 210 to modify the operation of the mixers 205 and 206, as described below.

In one embodiment, in a calibration phase the oscillating signal 211 is monitored, and used to determine calibration values that are used to modify the operation of the mixers 205 and 206, to suppress the unwanted signals. In another embodiment, during operation it is determined from the digitising receiver 210 that leakage of the LO signal directly across the mixer 205 is occurring. To suppress the resulting unwanted signals, the DC offset (i.e. the relative DC levels) of the in-phase and quadrature inputs to the mixer 205 (and/or mixer 206 if appropriate) are modified. In yet another embodiment, during operation it is determined that there are image frequency signals in the output of the mixer 205. To suppress the unwanted image frequency signals, the amplitude and/or phase of the in-phase and quadrature inputs to the mixer 205 (and again and/or mixer 206 if appropriate) are modified. In another embodiment, modifications to the mixers 205 and/or 206 and/or modifications to the inputs to the mixers 205 and/or 206 are stored and may be recalled when returning to a desired oscillating frequency. In each case, the oscillating signal 211 continues to be monitored until the required modification has been achieved.

It will be appreciated that in other embodiments, a combination of some or all of the above techniques, and/or other appropriate techniques, may be used.

As mentioned above, the variable frequency oscillator circuit 200 comprises a modulator 215. This can be used in a particularly advantageous fashion to modulate the phase and/or amplitude of the oscillating signal 211. In particular, by applying a constant rate of change of phase, the modulator 215 will have the effect of offsetting the frequency. The unwanted effects of the modulation made can be adjusted for by the digital processing circuit 108 of the superhet receiver circuit 100, as it can be fed details of the modulation performed by the modulator 215, and so will be able to adjust for any disadvantageous effects the modulation would otherwise cause. However, by for example sweeping the frequency across a small frequency range, the digital processing circuit 108 will be more able to identify and eliminate unwanted signals, which might otherwise be impossible to identify from the digitised signals.

It will however be appreciated that in other embodiments of the invention, the variable frequency oscillator circuit need not comprise such a modulator. It will also be appreciated that in other embodiments, the superhet receiver circuit could be implemented with a different variable frequency oscillator, for example a standard known variable frequency oscillator. Further, it will also be appreciated that the variable frequency oscillator discussed above could be used in circuits other than a superhet receiver circuit.

While the present invention has been described and illustrated with reference to particular embodiments, it will be appreciated by those of ordinary skill in the art that the invention lends itself to many different variations not specifically illustrated herein.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. A variable frequency oscillator circuit for generating an oscillating signal of a desired frequency, the variable frequency oscillator circuit comprising:
   a fixed frequency oscillator for generating an output signal having a first frequency;
   one or more frequency dividers, each arranged to receive the output of the fixed frequency oscillator and generate a signal having a divided frequency that is a divided version of the first frequency; and
   one or more mixers, arranged to mix the outputs of the one or more frequency dividers to generate the oscillating signal of the desired frequency;
   wherein the variable frequency oscillator circuit is arranged to modify the operation of the one or more mixers to suppress, using calibration values determined for the variable frequency oscillator circuit, one or more unwanted signals in the generated oscillating signal.

2. The variable frequency oscillator circuit of claim 1, wherein at least one mixer of the one or more mixers is arranged to receive an in-phase signal and a quadrature signal.

3. The variable frequency oscillator circuit of claim 2, wherein the variable frequency oscillator circuit modifies the operation of the one or more mixers by adjusting DC levels of the received in-phase signal and the quadrature signal.

4. The variable frequency oscillator circuit of claim 2, wherein the variable frequency oscillator circuit modifies the operation of the one or more mixers by adjusting amplitude and/or phase of the received in-phase signal and the quadrature signal.

5. The variable frequency oscillator circuit of claim 1, further comprising a phase and/or frequency modulator arranged to modulate the phase and/or frequency of the generated oscillating signal of the desired frequency.

6. A variable frequency oscillator circuit for generating an oscillating signal of a desired frequency, the variable frequency oscillator circuit comprising:
   a fixed frequency oscillator for generating an output signal having a first frequency;
   one or more frequency dividers, each arranged to receive the output of the fixed frequency oscillator and generate a signal having a divided frequency that is a divided version of the first frequency;

one or more mixers, arranged to mix the outputs of the one or more frequency dividers to generate the oscillating signal of the desired frequency; and a receiver arranged to receive the generated oscillating signal and identify unwanted oscillating signals at frequencies other than the desired frequency, wherein the variable frequency oscillator circuit is arranged to modify the operation of the one or more mixers to suppress one or more of the unwanted oscillating signals in the generated oscillating signal.

7. The variable frequency oscillator circuit of claim 6, wherein the one or more unwanted signals include output by a mixer of the one or more mixers, and said one or more unwanted signals are suppressed using a filter.

8. The variable frequency oscillator circuit of claim 7, wherein the filter is a high-pass filter.

9. The variable frequency oscillator circuit of claim 6, wherein the receiver is a digitising receiver.

10. The variable frequency oscillator circuit of claim 9, wherein the digitising receiver is included in a MIMO integrated circuit.

11. The variable frequency oscillator circuit of claim 6, wherein at least one mixer of the one or more mixers is arranged to receive an in-phase signal and a quadrature signal, and wherein the variable frequency oscillator circuit modifies the operation of the one or more mixers by adjusting DC levels of the received in-phase signal and the quadrature signal.

12. The variable frequency oscillator circuit of claim 6, wherein at least one mixer of the one or more mixers is arranged to receive an in-phase signal and a quadrature signal, and wherein the variable frequency oscillator circuit modifies the operation of the one or more mixers by adjusting amplitude and/or phase of the received in-phase signal and the quadrature signal.

13. A method of generating an oscillating signal of a desired frequency, the method comprising:

generating a fixed frequency oscillating signal having a first frequency;

dividing the fixed frequency oscillating signal into one or more divided signals, each of the one or more divided signals having a divided frequency that is a divided version of the first frequency;

mixing the one or more divided signals to generate the oscillating signal of the desired frequency;

identifying, in the generated oscillating signal, one or more unwanted signals at frequencies other than the desired frequency using a receiver that receives the generated oscillating signal; and modifying the mixing of the one or more divided signals to suppress the one or more unwanted signals in the generated oscillating signal.

14. The method of claim 13, wherein modifying the mixing of the one or more divided signals to suppress the one or more unwanted signals includes using calibration values determined for the variable frequency oscillator circuit.

15. The method of claim 14, further comprising determining the calibration values for the variable frequency oscillator circuit by analysing analyzing the oscillating signal of the desired frequency generated by the variable frequency oscillator circuit.

16. The method of claim 13 wherein modifying the mixing of the one or more divided signals comprises filtering the output of a mixer of the one or more mixers.

17. The method as claimed in claim 16, wherein the filtering is high-pass filtering.

18. The method of claim 13, wherein mixing of the one or more divided signals uses an in-phase signal and a quadrature signal, and wherein modifying the mixing of the one or more divided signals includes adjusting DC levels of the in-phase signal and the quadrature signal.

19. The method of claim 13, wherein mixing of the one or more divided signals uses an in-phase signal and a quadrature signal, and wherein modifying the mixing of the one or more divided signals includes adjusting amplitude and/or phase of the received in-phase signal and the quadrature signal.

20. The method of claim 13, further comprising modulating phase and/or frequency of at least one of the one or more divided signals to modulate the phase and/or frequency of the generated oscillating signal.

\* \* \* \* \*